US012593505B2

(12) United States Patent (10) Patent No.: US 12,593,505 B2
Sano (45) Date of Patent: Mar. 31, 2026

(54) FLEXIBLE ELECTRONIC DEVICE

(71) Applicant: Magnolia White Corporation, Tokyo (JP)

(72) Inventor: Takumi Sano, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 426 days.

(21) Appl. No.: 18/135,744

(22) Filed: Apr. 18, 2023

(65) Prior Publication Data

US 2023/0378195 A1 Nov. 23, 2023

(30) Foreign Application Priority Data

May 18, 2022 (JP) ................................. 2022-081310

(51) Int. Cl.
*H10D 86/40* (2025.01)
(52) U.S. Cl.
CPC ......... *H10D 86/443* (2025.01); *H10D 86/411* (2025.01)
(58) Field of Classification Search
CPC .................................................. H10D 86/443
See application file for complete search history.

(56) References Cited

U.S. PATENT DOCUMENTS

| | | | |
|---|---|---|---|
| 2017/0005077 A1* | 1/2017 | Kim | .................... H01L 25/0753 |
| 2020/0212117 A1* | 7/2020 | Jeon | .................... H10D 86/443 |
| 2022/0320259 A1 | 10/2022 | Sano | |

FOREIGN PATENT DOCUMENTS

| | | | |
|---|---|---|---|
| JP | 2021-106199 A | 7/2021 | |
| WO | WO-2020206971 A1 * | 10/2020 | ............. H10D 86/00 |

* cited by examiner

*Primary Examiner* — Peter M Albrecht
(74) *Attorney, Agent, or Firm* — XSENSUS LLP

(57) ABSTRACT

The purpose of the invention is to realize a flexible electronic device of high reliability. The present invention takes a following structure to realize the purpose. An electronic device including: a plurality of element areas, arrayed in a first direction with a first distance, and arrayed in a second direction with a second distance, the plurality of element areas being connected with each other in the first direction by a first organic insulating film, which meanderingly extends in the first direction, graphene being formed on a surface of the first organic insulating film to form a first wiring, the plurality of element areas being connected with each other in the second direction by a second organic insulating film, which meanderingly extends in the second direction, graphene being formed on a surface of the second organic insulating film to form a second wiring.

15 Claims, 21 Drawing Sheets

B-B

C-C

D-D

E-E

F-F

G-G

H-H

FLEXIBLE ELECTRONIC DEVICE

CLAIM OF PRIORITY

The present application claims priority from Japanese Patent Application JP 2022-081310 filed on May 18, 2022, the content of which is hereby incorporated by reference into this application.

BACKGROUND OF THE INVENTION

(1) Field of the Invention

The present invention relates to an electronic device having flexibility and stretchability.

(2) Description of the Related Art

A demand for a flexible and stretchable electronic device is expanding. Usages of such flexible electronic devices are, for example, to attach to a curved housing including an electronic device, to attach to the curved display media, to attach to human body as a sensor and so forth. As to elements, there are, for example, various sensors such as a touch sensor, a temperature sensor, a pressure sensor, an acceleration sensor, and so forth, or lighting elements which constitute various display devices, light valves and so forth.

In sensor devices, scanning lines and signal lines are used to control each of the elements. Flexible electronic devices must adapt bending or stretching. Patent document 1 discloses a device having a structure that can adapt the stretching and bending by making the scanning lines and signal lines form as serpentine (herein after it may be called as meander wirings).

Patent document 1: Japanese patent application laid open No. 2021-106199

SUMMARY OF THE INVENTION

A flexible electronic device can have some adaptability to stretching and bending by making the scanning liens and signal lines in meander structure. However, a uniform stress is not necessarily applied to entire wirings when the device is stretched or bent even scanning lines and signal lines are made in meander wiring structure.

That is to say, a disconnection occurs at a portion in which a maximum stress is built when a device is stretched or bent. Conversely, an adaptability of the flexible electronic devices to bending or stretching can be improved by modifying the structure at a portion in which a maximum stress is built.

The purpose of the present invention is to realize a flexible electronic device having high adaptability to stretching or bending by modifying the structure at a portion in which a maximum stress is built, and thus, to realize a reliable flexible electronic device.

The present invention solves the above explained problems; the representative structures are as follows.

(1) An electronic device including: a plurality of element areas, arrayed in a first direction with a first distance, and arrayed in a second direction with a second distance, the plurality of element areas being connected with each other in the first direction by a first organic insulating film, which meanderingly extends in the first direction, graphene being formed on a surface of the first organic insulating film to form a first wiring, the plurality of element areas being connected with each other in the second direction by a second organic insulating film, which meanderingly extends in the second direction, graphene being formed on a surface of the second organic insulating film to form a second wiring.

(2) The electronic device according to (1), in which the plurality of element areas, the first organic insulating film and the second organic insulating films are formed on a basic structure which is formed from organic insulating film.

(3) The electronic device according to (2), in which each of the basic structure, the first organic insulating film and the second organic insulating film has a meander structure.

(4) The electronic device according to (1), in which the element area includes an inorganic insulating film.

(5) The electronic device according to (1), in which a third wiring, which extends in the first direction, is formed from a first metal, and a fourth wiring, which extends in the second direction, is formed from a second metal, and the first wiring and the third wiring are connected with each other, and the second wiring and the fourth wiring are connected with each other.

(6) The electronic device according to (5), in which an edge of the third wiring overlaps the first wiring, and an edge of the fourth wiring overlaps the second wiring.

(7) The electronic device according to (5) in which the first wiring and the third wiring are scanning lines, and the second wiring and the fourth wiring are signal lines.

(8) The electronic device according to (2), in which the basic structure, the first organic insulating film and the second organic insulating film are formed from polyimide.

DETAILED DESCRIPTION OF THE PREFERRED EMBODIMENTS

The present invention is explained in detail by the following embodiments.

Embodiment 1

Figure 1:
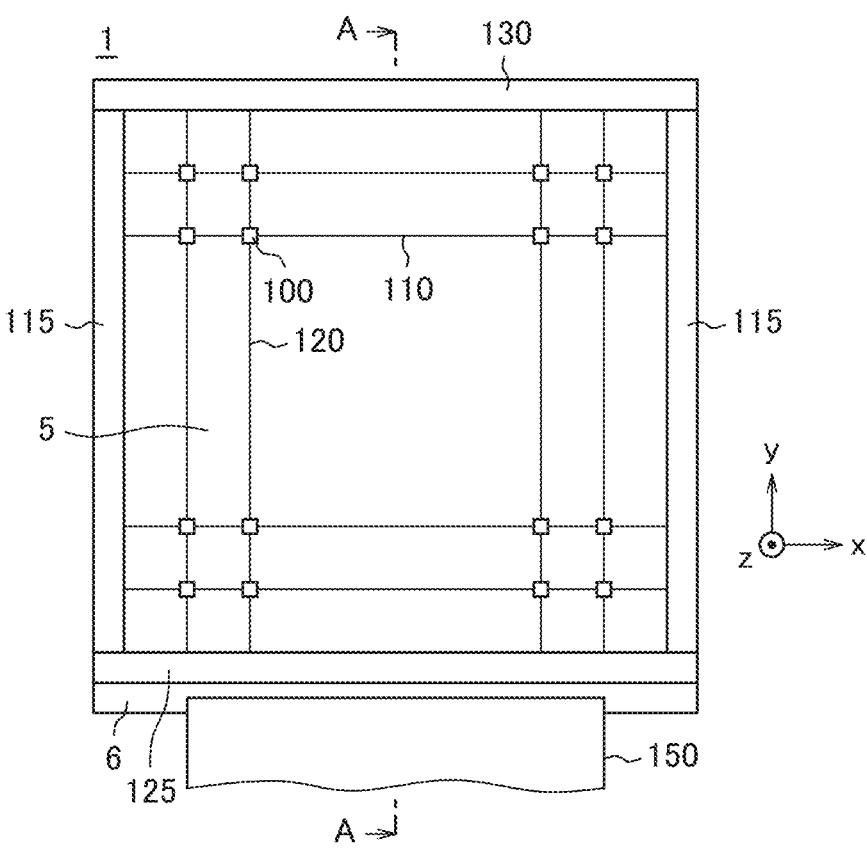
FIG. 1 is a plan view of a flexible electronic device.

FIG. 1 is a plan view of a flexible electronic device 1 in embodiment 1. Even the flexible electronic device 1 of FIG. 1 is flat as a total, it can be bent in z direction or can be stretched in x-y plane. Even elongation at break of the flexible electronic device, namely, an elongation in which a flexible electronic device is broken, is different according to material which constitutes the flexible electronic device 1, a ratio of elongation at break can be achievable to 30% when the main materials are organic substance, which have high extensibility. In some cases, the elongation at break may become as high as 60%. On the other hand, when inorganic materials are used in many parts, the elongation at break is approximately 10% to 15%.

In FIG. 1, an active area 5 occupies a large portion in the flexible electronic device 1. In the active area 5, electronic elements 100 are arranged in matrix. As to the electronic element 100, for example, a senser, a semiconductor element, an actuator and so forth can be arranged. As sensors, for example, a light sensor of visible light or infra-red light, a temperature sensor, a pressure sensor, a touch sensor and so forth can be arranged. As semiconductor devices, for example, a light emitting element, a light receiving element, a diode, a transistor and so forth can be arranged. As actuators, for example, a piezo element and so forth can be arranged.

Each of electronic elements is connected to the scanning line 110 and the signal line 120. The scanning lines 110 extend in lateral direction (the x direction, corresponds to the first direction) and are arranged in longitudinal direction (the y direction, corresponding to the second direction). The signal lines 120 extend in longitudinal direction (the y direction) and are arranged in lateral direction (the x direction). The structures of scanning lines 110 and the signal lines 120 are important to form a stretchable electronic device. That is to say, the scanning lines 110 and the signal lines 120 should have a structure in which a disconnection does not easily occur when the flexible electronic device is stretched.

In FIG. 1, driving circuits 115 and 125, and a terminal area 6 are disposed outside of the display area 5. Scanning line driving circuits 115 are disposed at both sides in the x direction of the display area 5; a power circuit 130 which supplies power to the electronic elements 100 is disposed at a top position in the y direction of the display area 5; a signal line driving circuit 125 is disposed at a bottom side in the y direction of the display area 5. The terminal area 6 is disposed at further bottom position than the signal driving circuit 125. A flexible wiring substrate 150, which supplies power and signals to the flexible electronic device 1 and send signals to outside of the flexible electronic device 1, is connected to the terminal area 6.

Figure 2:
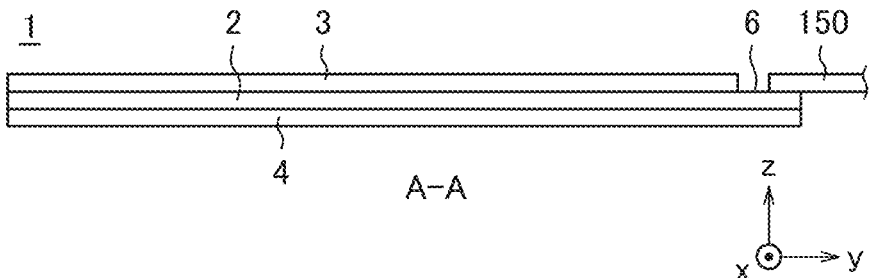
FIG. 2 is a cross sectional view of FIG. 1 along the line A-A.

FIG. 2 is a cross sectional view of FIG. 1 along the line A-A. FIG. 2 is a schematic cross-sectional view. In FIG. 2, the electronic elements 100, the scanning lines 110, the signal lines 120 and so forth described with reference to FIG. 1 are disposed in an element layer 2. That is to say, a function as the flexible electronic device 1 is disposed on the element layer 2. The element layer 2 is sandwiched by a top protecting layer 3 at the top and a bottom protecting layer 4 at the bottom. Both the top protecting layer 3 and the bottom protecting layer 4 are formed from a material which is easy to be deformed elastically, that is to say, a material having small young's modulus.

In FIG. 2, the active area 5, driving circuits 115 and 125 and so forth are covered by the top protecting layer 3 and the bottom protecting layer 4; a terminal portion of the element layer 2 is not covered by the top protecting layer 3, which constitutes a terminal area 6. The terminal area 6 is protected only from bottom side by the bottom protecting layer 4. The flexible wiring substrate 150 is connected to the terminal area 6.

Figure 3:
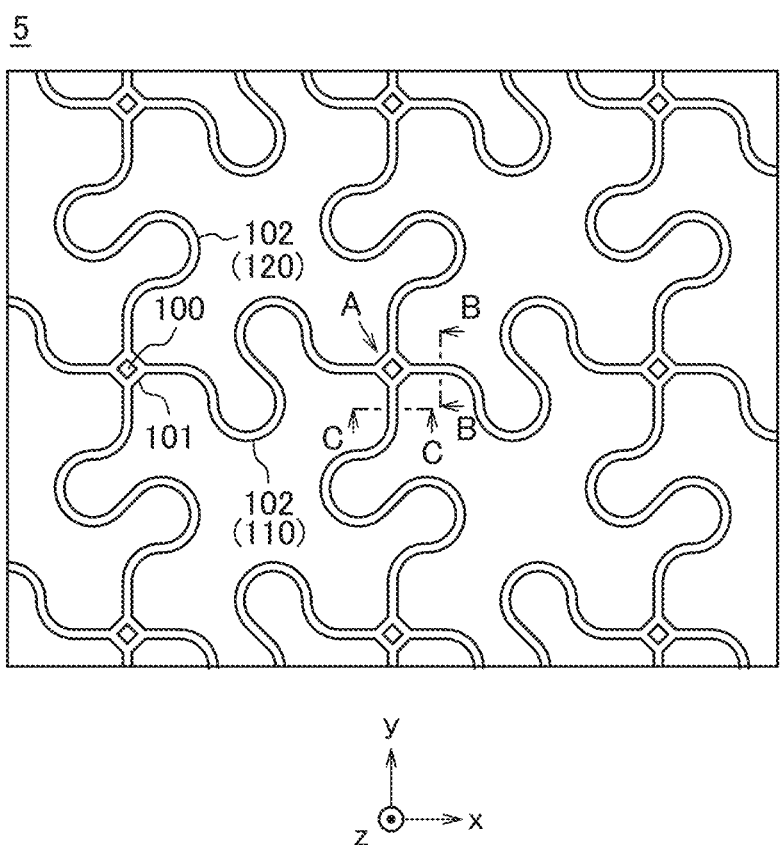
FIG. 3 is a plan view of wiring configuration in the active area.

FIG. 3 is a plan view of the display area 5 which has a meander structure as a comparative example. The structures having meander structure, which is explained in FIGS. 3 to 10 may include novel structure, thus, those structures in the comparative examples are not prior art. The comparative example is just an example for comparison with the embodiments. FIG. 3 is a main structure of the element layer 2 in FIG. 2. That is to say, the element layer 2 is not a simple plate but are formed in so called mesh structure. The meander structure 102, on which the scanning lines 110 and the signal lines 120 are formed, and the element areas 101 formed at cross regions of the scanning lines 110 and the signal lines 120 constitutes a so called mesh structure.

In FIG. 3, the meander structure 102 and the electronic element area 101, formed at the cross points of the meander structures 102, are formed from resin as polyimide. The scanning lines 110, the signal lines 120, the electronic elements 100, and so forth are formed on the resin, which constitutes a base structure 10. In FIG. 3, electronic elements 100, which are formed as diamond, are formed on the element areas 101. The reason of such structure is to mitigate a stress in components when the flexible electronic device 1 is stretched.

In FIG. 3, the element 100, which is formed as diamond, has a diameter in the x direction of, e.g., 100 μm and a diameter in the y direction of e.g. 100 μm. A pitch in the x direction of the elements 100 is, for example, 250 μm. A pitch in the y direction of the elements 100 is, for example, 250 μm. A width of the base structure 10, on which scanning lines 110 and the signal lines 120 are formed, is, for example, 30 μm.

Figure 4:
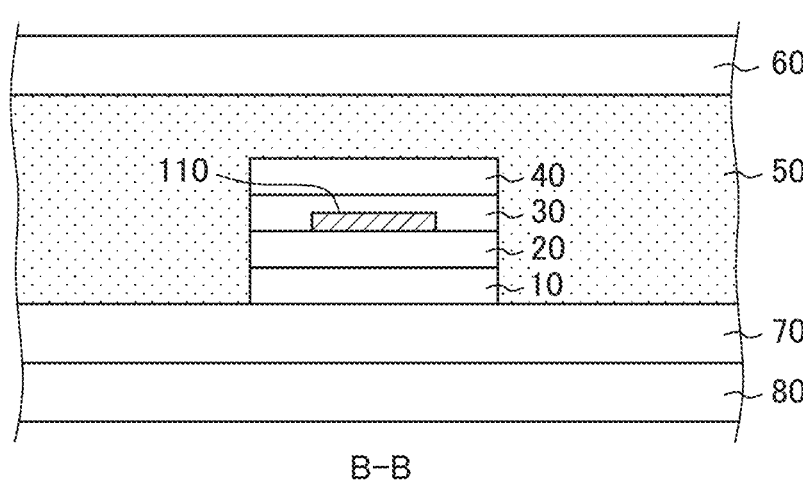
FIG. 4 is a cross sectional view of FIG. 3 along the line B-B.

FIG. 4 is a cross sectional view of FIG. 3 along the line B-B, which is a cross sectional view of the meander structure including the scanning line 110. In FIG. 4, a first organic insulating film 20 is formed on the base structure 10. The scanning line 110 is formed on the first organic insulating film 20. A second organic insulating film 30 is formed on the scanning line 110. The plan view of the meander structure 102 including the scanning lines 110 in FIG. 3 shows a plan shape of the base structure 10.

The base structure 10, the first organic insulating film 20 and the second organic insulating film 30 are formed from polyimide. Since polyimide has good mechanical strength, heat resistance and so forth, it is suitable for a material for the base structure 10 of the scanning line 110 and the signal lines 120. That is to say, the polyimide undertakes a stress when the flexible electronic device 1 is stretched, thus, stresses in the metal wires as the scanning lines 110 and so forth are mitigated.

The scanning line 110 is formed from, for example, TAT (Ti—Al—Ti, Titanium-Aluminum-Titanium). In the three layers structure, the aluminum mainly undertakes conductivity, the titanium is used to protect the aluminum or to improve a contact with other wirings. Alternatively, MoW (Molybdenum-Tungsten alloy) and so forth are adopted for the scanning lines 110 according to usages of the flexible electronic devices 1.

Since the meander structure 102 including the scanning line 110 (herein after, may be called simply as scanning line 110) is mechanically unstable as depicted in FIG. 3, it is fixed by being sandwiched from the top side and the bottom side by protecting layers (items 3 and 4 in FIG. 2). At the outset, the meander structure 102 including the scanning lines 110 is covered by a top buffer layer 50, which is formed from organic material; a top protecting layer 60, which is formed from organic material, is formed on the top buffer layer 50. A bottom buffer layer 70, which is formed from organic material, is disposed under the base structure 10; a bottom protecting layer 80, which is formed from organic material, is disposed under the bottom buffer layer 70.

As described above, the meander structure including the scanning lines 110 is unstable structure; however, it can be stable by being sandwiched with the top buffer layer 50 and the bottom buffer layer 70 from top and bottom of the meander structure 10, and further sandwiched with the top protecting layer 60 and the bottom protecting layer 80 from top and bottom. In the meantime, since the electronic device in the present invention is a flexible electronic device, it is necessary to stretch when a stretching force is applied from outside. Therefore, it is necessary that the buffer layers 50 and 70 and the protecting layers 60 and 80, which sandwich the meander structure formed from polyimide, are more stretchable compared with polyimide, in other words, to have smaller young's modulus compared with young's modulus of polyimide. Such materials are, for example, resins of acrylic, urethan, epoxy, silicone and so forth.

Figure 5:
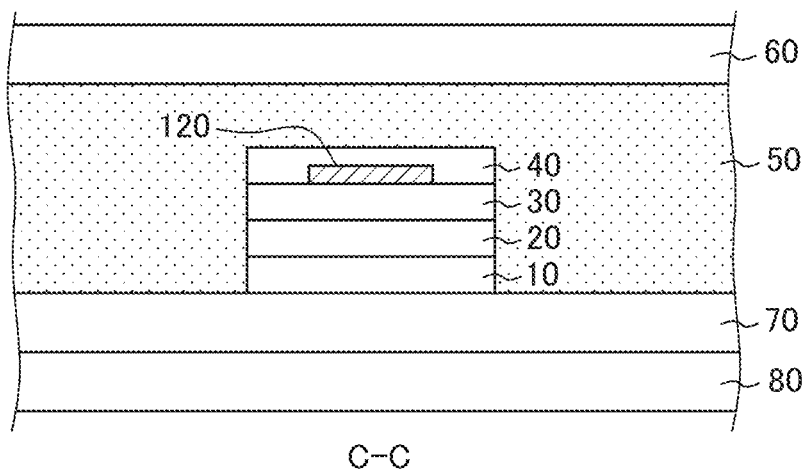
FIG. 5 is a cross sectional view of FIG. 3 along the line C-C.

FIG. 5 is a cross sectional view of FIG. 3 along the line C-C, which is a cross sectional view of the meander structure 102 including the signal line 120. In the meander structure 102 in FIG. 5, the first organic film 20 and the second organic film 30 are formed on the base structure 10 in succession and patterned. The signal line 120 is formed on the second organic film 30. In embodiment 1, the signal line 120 is formed from the same material as the scanning line 110, namely, has a structure of TAT (Ti—Al—Ti), however, the material of the signal line 120 can be changed according to usage of the flexible electronic device. Other structures are the same as explained with reference to FIG. 4 for the structure of the scanning line 110.

Figure 6:
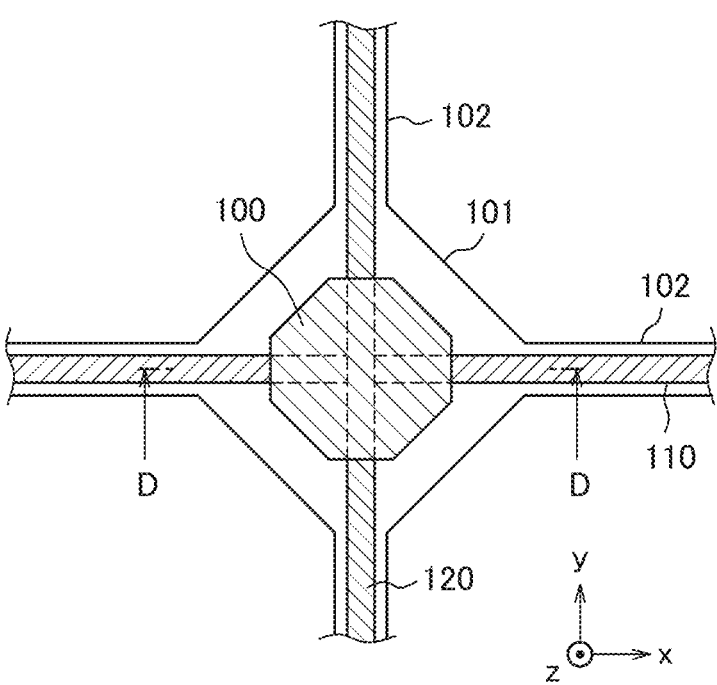
FIG. 6 is a plan view of an element and its vicinity.

FIG. 6 is a plan view of the element area 101. The element area 101 is also defined by the base structure 10 formed from polyimide. The structure of the element area 101 in FIG. 6 is a diamond shape, however, since the apex of the diamond is connected either to the scanning line 110 or the signal line 120 of meander structures 102, outer shape of the element area 104 looks like octagon. Even the scanning lines 110 and the signal lines 120 are straight lines in FIG. 6, they are in meander structure as depicted in FIG. 3 outside of FIG. 6.

In FIG. 6, the element 100 is disposed on the element area 101. The outer structure of the element 100 is approximately octagon, in which apexes of the diamond are truncated. The scanning line 110 and the signal line 120 cross each other via insulating film under the element 100. FIG. 6 is, however, a schematic drawing; in an actual device, the scanning line 110 and the signal line 120 are connected with a transistor to drive the element 100 and so forth.

Figure 7:
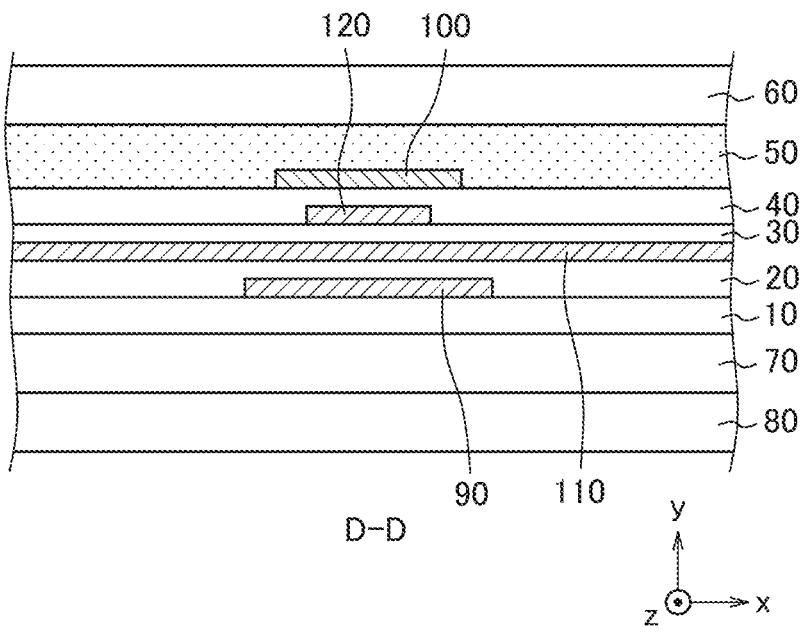
FIG. 7 is a cross sectional view of FIG. 6 along the line D-D.

FIG. 7 is a cross sectional view of FIG. 6 along the line D-D. In FIG. 7, inorganic insulating film 90 is formed on the base structure 10. The inorganic insulating film 90 stops impurities intruding from bottom side to prevent the element 100, which is formed above the inorganic insulating film 90, from being contaminated by the impurities. In FIG. 7, the inorganic insulating film 90 is formed on the base structure 10, however, it is only an example; the inorganic insulating film 90 can be formed at nearer layer to the element 100 according to necessity.

The inorganic insulating film 90 is formed from a silicon nitride film (a SiN film), a silicon oxide film (a SiO film), or laminated film of those films. Sometimes, aluminum oxide (an AlO film) is used as the inorganic insulating film 90. A rigidity of the inorganic insulating film 90 is high, however, it is formed only at the element area 101, thus, influence on the stretchability of the flexible electronic device 1 is not high.

The first organic insulating film 20 is formed from, e.g., polyimide, covering the inorganic insulating film 90. The scanning line 110 extends in lateral direction (in the x direction) on the first organic insulating film 20. The second organic insulation film 30, formed from polyimide, is formed covering the scanning line 110 and the first organic insulating film 20. The signal line 120 extends in the y direction on the second organic insulating film 30. A third organic insulating film 40 is formed covering the signal lines 120. The element 100 is disposed on the third organic insulating film 40.

Since FIG. 7 is a schematic view, connecting structures between the element 100 and the scanning line 110, and between the element 100 and the signal line 120, are omitted. Even it depends on what kind of element 100 is used, in general, a thin film transistor (TET) is formed between the element 100 and the scanning line 110 or signal line 120; the TET is controlled by the scanning line control circuit 115 and the signal line control circuit 125, and thus, a signal from the element 100 or a signal to the element 100 are controlled. Therefore, in the area in which element 100 is formed, there is a possibility that plurality of organic or inorganic insulating films are formed. However, in FIG. 7 and so forth, such insulating films are not formed outside the element 100 area to facilitate expansion and contraction of the flexible electronic device.

The plan view of FIG. 6 corresponds to a cross sectional structure from the base structure 10 through element 100 in FIG. 7. This structure, however, is not mechanically stable as depicted in a plan view of FIG. 3. Thus, as explained in FIG. 4, the top buffer layer 50, the top protecting layer 60, the bottom buffer layer 70 and the bottom protecting layer 80 are formed to make the total structure in a stable plate shape. In addition, as explained in FIG. 4, young's modulus of each of the materials forming the top buffer layer 50, the top protecting layer 60, the bottom buffer layer 70 and the bottom protecting layer 80 is smaller than young's modulus of each of the materials forming the basic structure 10, the first organic insulting film 20, the second organic insulating film 30 and so forth, therefore, a extensibility of the flexible electronic device 1 is not deteriorated.

Figure 8:
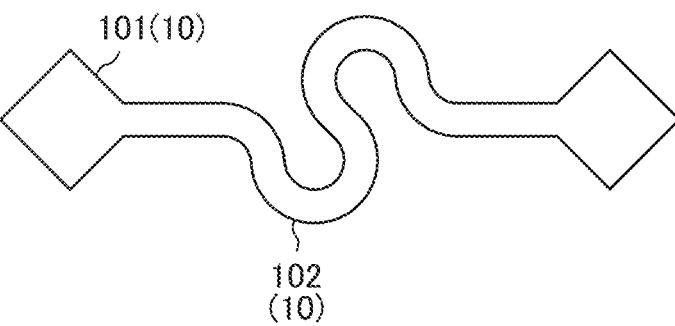
FIG. 8 is a plan view which shows a part of a base structure on which wirings and elements are formed.

FIG. 8 is a plan view of the base structure 10, formed from polyimide, which includes the scanning area 102 and the element area 101. The element area 101 on which the element is disposed is an approximately diamond shape; most of other area is in meander structure 102 so that the device can be flexibly extended and contracted.

Figure 9:
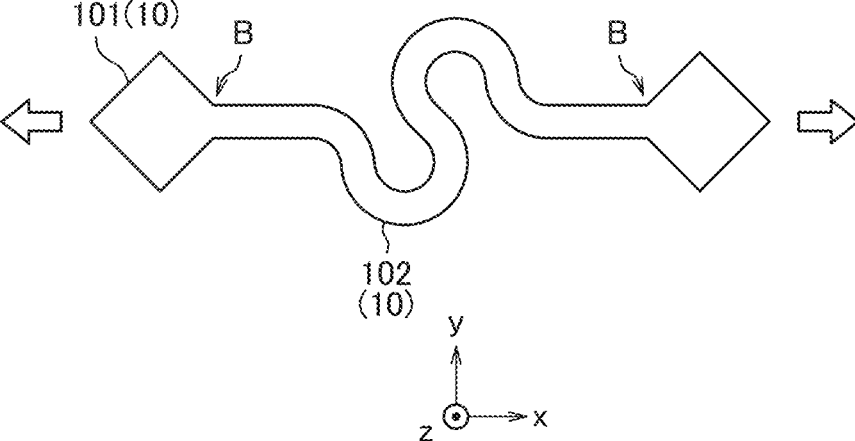
FIG. 9 is a plan view which shows a portion in which a large stress is built when the flexible electronic device is stretched in lateral direction (the x direction)

FIG. 9 is a plan view to show a problem when the structure of FIG. 8 is stretched in a direction indicated by white arrow. In this case, a stress is built at connection portion B between the element area 101, which is diamond shaped, and a straight portion 111 of the meander structure 102, on which the scanning line 110 is formed (herein after may be called as simply scanning line 110). In addition, the element area 101, which includes element 100, inorganic insulating film 90 and so forth, has higher rigidity than other portions. Therefore, a stress is further built at the connection portion B between the element area 101, which is diamond shaped, and the straight portion 111 of the scanning line area 102.

Figure 10:
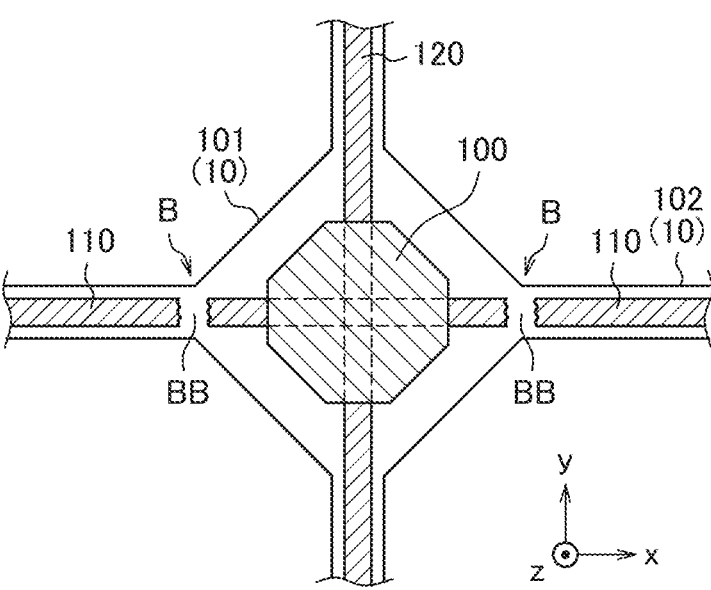
FIG. 10 is a plan view which shows a break occurring in a wiring at which a large stress is built as shown in FIG. 9.

Nevertheless, since the resin as polyimide, which constitutes the base structure 10 is strong, it is not broken easily; however, the scanning line 110, which is formed on the base structure 10 and is made of metal, is easily broken. This phenomenon is depicted in FIG. 10. FIG. 10 is a plan view which shows the scanning line 110 is broken at the portion BB in which a large stress is built when the flexible electronic device 1 is stretched in lateral direction (the x direction). The structure of embodiment 1 is to realize the structure which can prevent such breaking of the scanning line 110. In the meantime, FIG. 10 shows when the flexible electronic device 1 is stretched in lateral direction (the x direction); however, when the flexible electronic device is stretched in longitudinal direction (the y direction), the same phenomenon occurs in the signal line 120. The present invention is also applicable to the problem in the signal lines 120.

Figure 11:
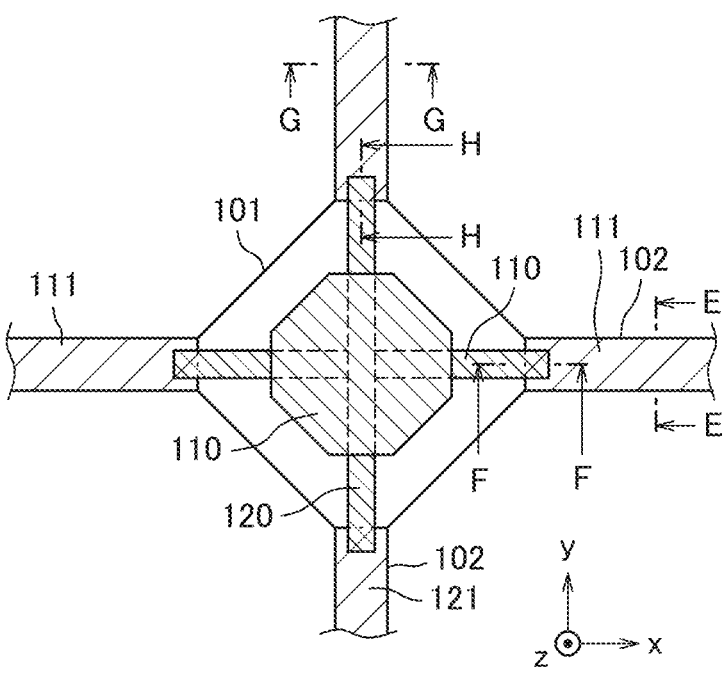
FIG. 11 is a plan view to show a general structure of embodiment 1.

FIG. 11 is a plan view of an outline structure of embodiment 1 to counter measure the above problems. In FIG. 11, the element area 101 and the meander structure 102 are formed from the base material 10, the first organic insulating film 20, the second organic insulating film 30, the third organic insulating film 40 and so forth, which are the same as the comparative example. The feature of FIG. 11 is that, in the meander structure, a portion which constructs the scanning line 111 and a portion which constructs the signal line 121 are formed from graphene structure not from metal film.

Graphene is a sheet formed from one layer of a thickness of one carbon atom. An electrical conductivity of graphene is supposed to be as high as a cupper of metal, and heat conductivity is higher than silver. On the other hand, heat-resistant of graphene is high; Graphene does melt up to 3000 degrees Celsius. In addition, graphene has flexibility and stretchability, thus, it is possible to be bent or stretched. Therefore, graphene is very suitable for scanning lines or signal lines in a flexible electronic device.

Graphene is formed only from carbon as graphite. Graphene can have different characteristics from characteristics of mineral carbon by that carbon atoms are covalently bonded and arranged in a sheet having honeycomb structure so that thickness of the sheet is kept thin. The inventor found that the graphene can be formed by irradiation with laser on a surface of polyimide with a certain condition. The graphene sheet formed on the top surface of the polyimide in a thickness of 10 nm or less (in most cases 5 nm or less) under the above condition, has enough electric characteristics. In addition, such graphene can stretch or contract according to a stretch or a contract of polyimide. Therefore, the flexible electronic device is not destroyed as far as the polyimide as the base structure is not broken.

In FIG. 11, such graphene is formed on the first organic insulating film 20 to form the scanning lines 111 and such graphene is formed on the second organic insulating film 30 to form the signal lines 121. On the other hand, in an element area 101, the scanning lines 110 and the signal lines 120 are formed from metal in a conventional case. That is to say, the cross-sectional structure of the element area 101 is the same as FIG. 7.

Figure 12:
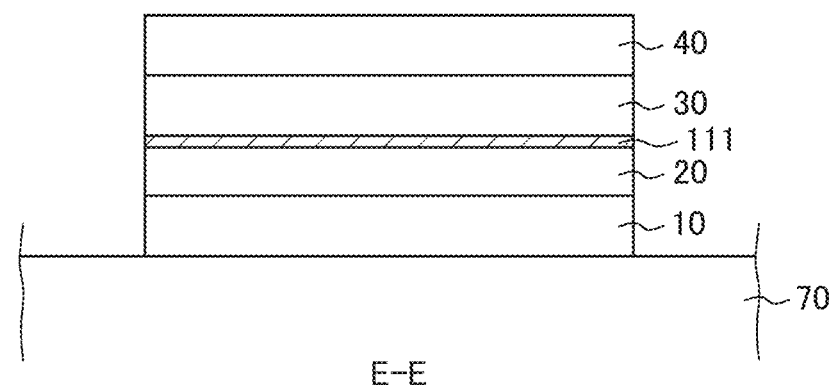
FIG. 12 is a cross sectional view of FIG. 11 along the line E-E.
Figure 13:
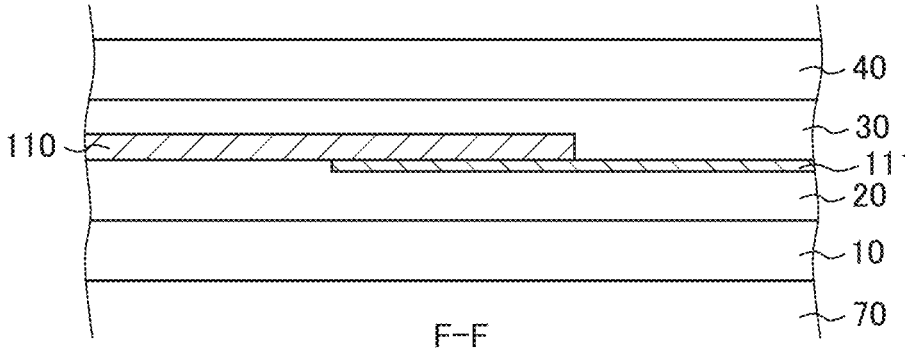
FIG. 13 is a cross sectional view of FIG. 11 along the line F-F.

FIG. 12 is a cross sectional view of FIG. 11 along the line E-E. In FIG. 12, a surface of the first organic insulating film 20 is converted to graphene to form a scanning lines 111. Therefore, a scanning lines 111 of meander structure 102, which is formed from graphene, must be connected with a scanning line 110, which is formed from metal, in the element area 101. FIG. 13 is a cross sectional view of FIG. 11 along the line F-F, which shows the above explained connection portion. In FIG. 13, in the meander structure, the scanning line 111 is formed from graphene on the surface of the first organic insulating film 20. On the other hand, in the element area 101, the scanning line 110 of metal film is formed. An electrical connection is made by that the scanning line 110 of metal film overlaps the scanning line 111 of graphene.

Figure 14:
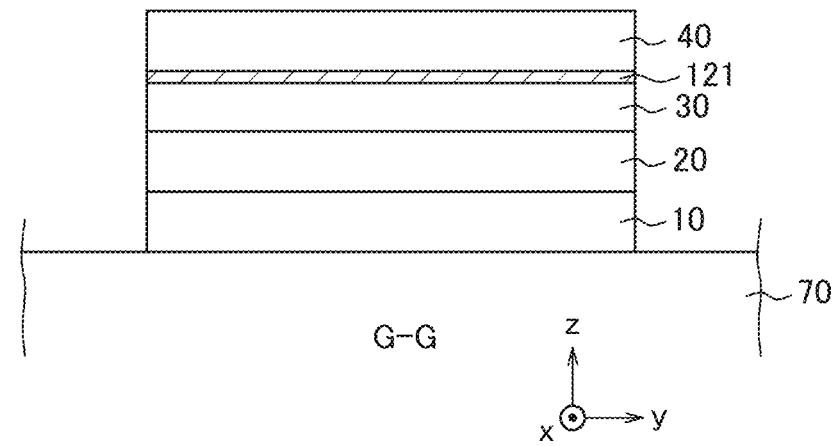
FIG. 14 is a cross sectional view of FIG. 11 along the line G-G.

FIG. 14 is a cross sectional view of FIG. 11 along the line G-G. In FIG. 14, a surface of the second organic insulating film 30 is converted to graphene to form a signal lines 121. On the other hand, in the element area 101, the signal line 120 is formed from metal as in a conventional case. Therefore, a signal lines 121 of meander structure 102, which is formed from graphene, must be connected with a signal line 120, which is formed from metal, in the element area 101.

Figure 15:
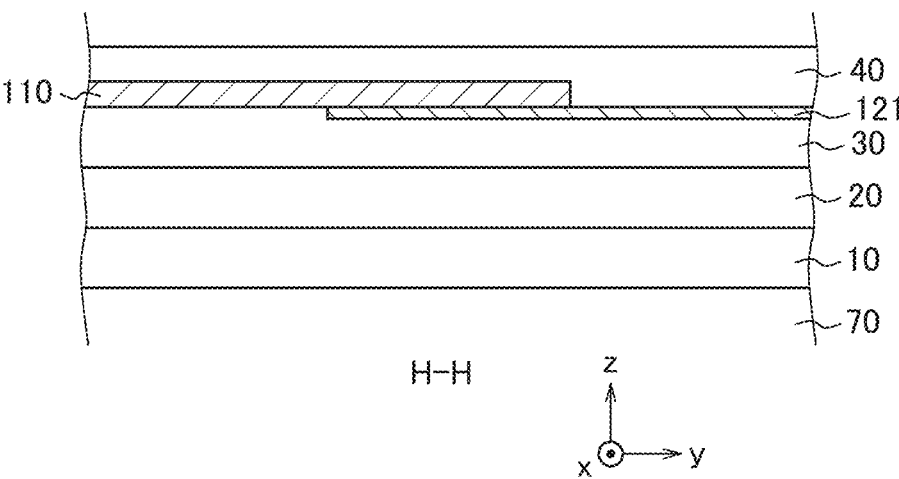
FIG. 15 is a cross sectional view of FIG. 11 along the line H-H.

FIG. 15 is a cross sectional view of FIG. 11 along the line H-H, which shows the above explained connection portion. In FIG. 15, in the meander structure, the signal line 121 is formed from graphene on the surface of the second organic insulating film 20. On the other hand, in the element area 101, the scanning line 110 of metal film is formed. An electrical connection is made by that the signal line 120 of metal film overlaps the signal line 121 of graphene.

Figure 16:
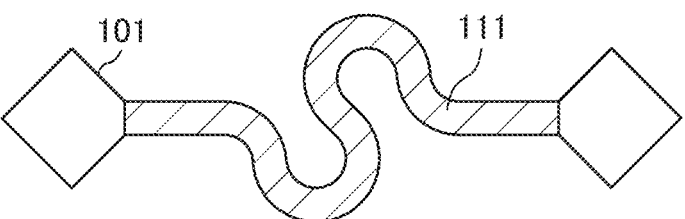
FIG. 16 is a plan view in which graphene is formed on a meander structure to form a scanning line.
Figure 17:
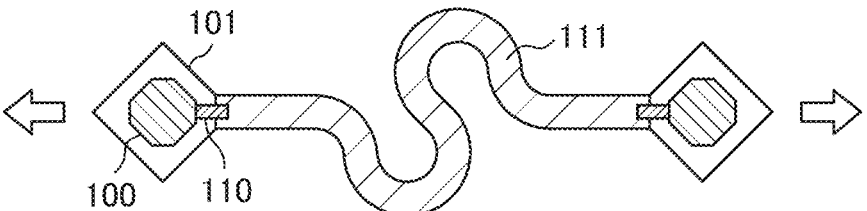
FIG. 17 is a plan view in which the scanning line of the element area and the scanning line of meander structure formed with graphene are connected each other.

FIG. 16 is a plan view of a part of the structure of the first organic insulating film 20 formed from polyimide, which shows the meander area 102 and the element area 101. Graphene is formed only on the meander structure 102. FIG. 17 is a plan view in which the element 100 and the scanning line 110 formed from metal are formed in the element area 101. The scanning line 110 overlaps the scanning line 111 to electrically connect with the scanning line 111.

Figure 18:
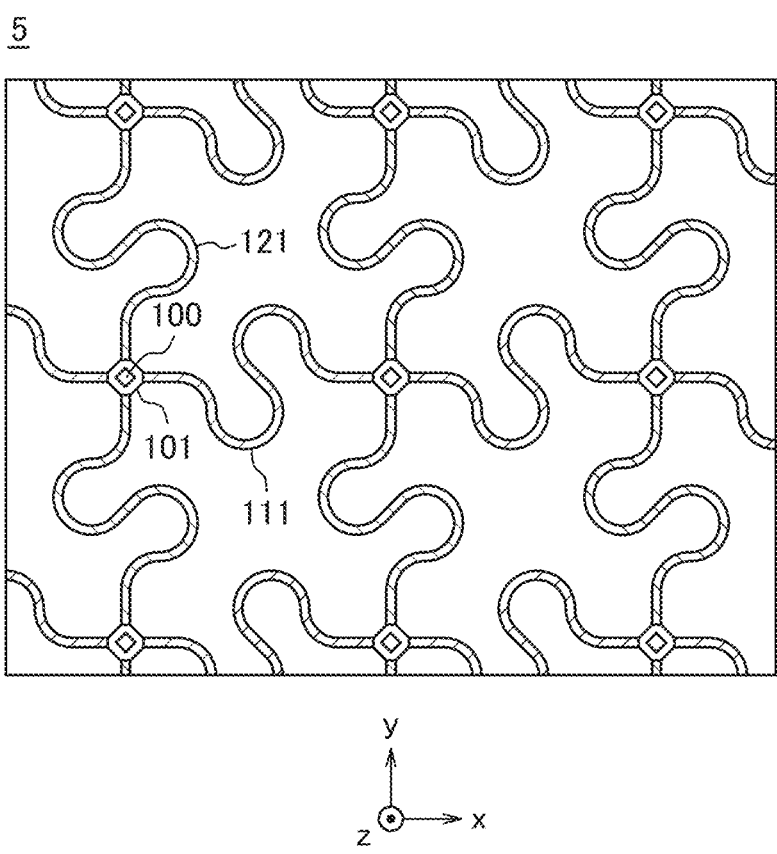
FIG. 18 is a plan view of an active area of embodiment 1.

FIG. 18 is a plan view in which the scanning line 111 is formed from graphene and the signal line 121 is formed from graphene in the active area 5. In FIG. 18, the scanning lines 111 extend in lateral direction (the x direction) in meandering; the scanning lines 111 extends in longitudinal direction (the y direction) in meandering. Other structures near the element area 101 is the same as explained in referring to FIG. 3.

FIG. 19 through FIG. 29 are figures to show examples of processes to realize the structure of embodiment 1 depicted in FIG. 11, FIG. 18 and so forth. In the meantime, the element area 101 including the element 100 and the meander structure area 102 including the scanning lines 111 and the signal lines 121 are formed simultaneously. Therefore, the process to form the meander structure 102 is changed according to the structure of the element 100. The processes explained below are only for the processes to form meander structure area 102, in which the scanning lines 111 and the signal lines 121 are formed.

Figure 19:
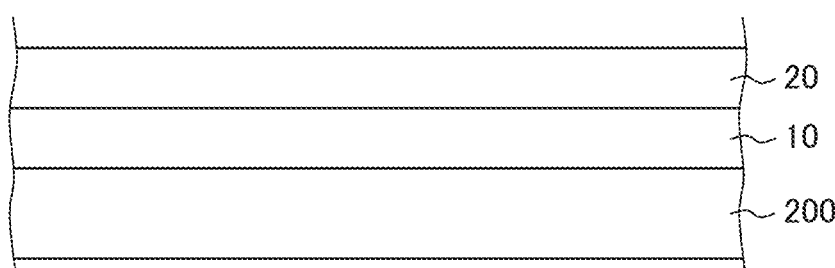
FIG. 19 is a cross sectional view of a first process to form the structure of FIG. 18.

FIG. 19 is a cross sectional view in which the base structure 10 and the first organic insulating film 20 are laminated on the glass substrate 200. The glass substrate 200 is used only in the manufacturing processes, but removed in the last process. In FIG. 19, the basic structure 10 is formed as that: polyamic acid, which is a material for polyimide, is coated on the glass substrate 200, and is imidized by baking. A thickness of the basic structure 10 is, e.g., 5 μm. After that, the first organic insulating film 20 is formed as that: polyamic acid is coated on the basic structure 10, and is baked for imidization. A thickness of the first organic insulating film 20 is, e.g., 1 to 5 μm. Manufacturing processes for the second organic insulating film 30 and the third organic insulating film 40 are basically the same as manufacturing processes for the basic structure 10 and the first organic insulating film 20.

Figure 20:
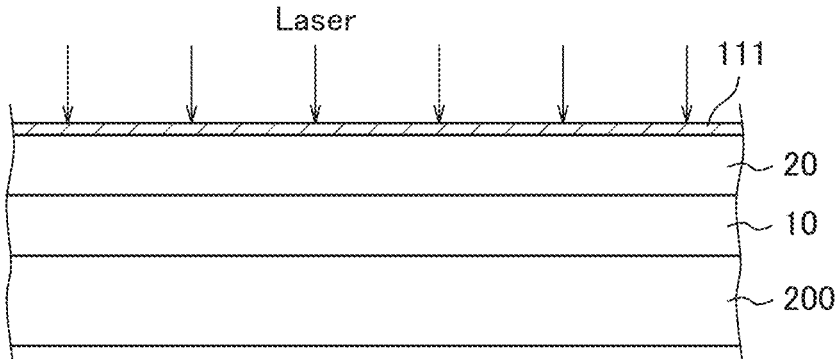
FIG. 20 is a cross sectional view in which laser is irradiated to a surface of the first organic insulating film to form graphene.

FIG. 20 is a cross sectional view in which laser is focused on and irradiates a surface of the first organic insulating film 20. The portion, to which the laser is applied, is converted to graphene 111. The region, in which graphene is formed, very thin as 10 nm or less. However, since the conductivity of graphene is very high, the graphene can perform the function as the scanning lines 111.

Figure 21:
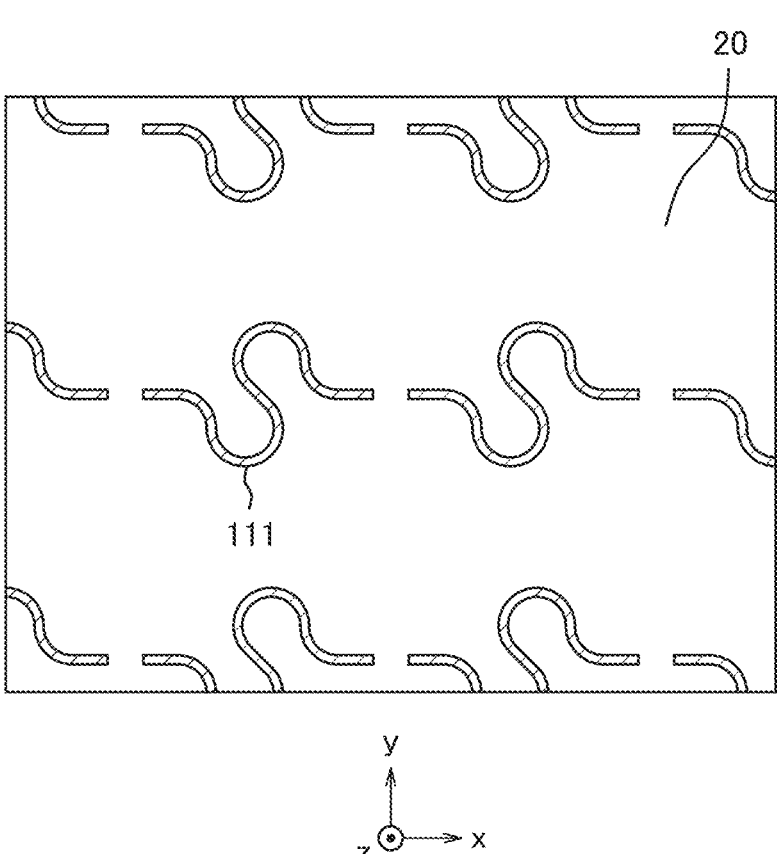
FIG. 21 is a plan view of graphene which constitutes a scanning line.

Irradiation with laser as shown in FIG. 20 is not made on all the area of the first organic insulating film 20; the laser beam is drawn as extending meanderingly in lateral direction (the x direction) to form scanning lines 111. FIG. 21 is a plan view to show such a laser beam drawing. In FIG. 21, the scanning lines formed from graphene, which extend meanderingly in lateral direction, are formed on the surface of the first organic insulating film 20.

Figure 22:
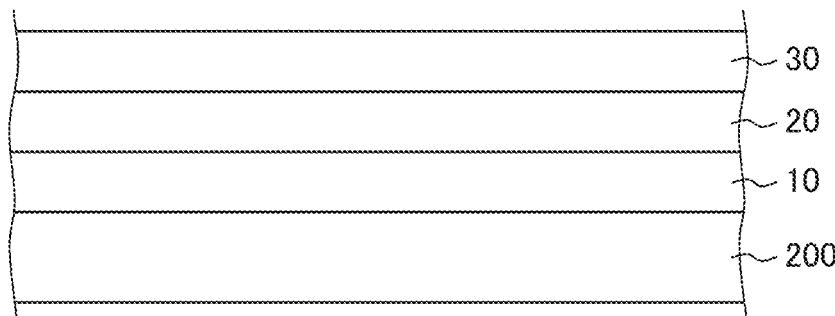
FIG. 22 is a cross sectional view in a process of signal line side to form the structure of FIG. 18.
Figure 23:
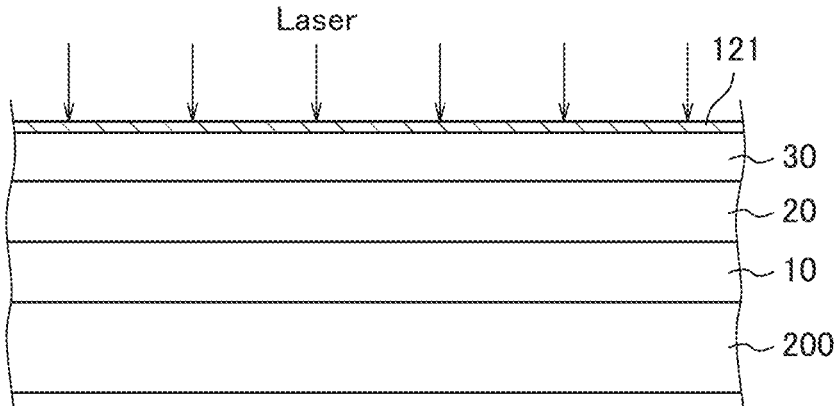
FIG. 23 is a cross sectional view in which laser is irradiated to a surface of the second organic insulating film to form graphene.
Figure 24:
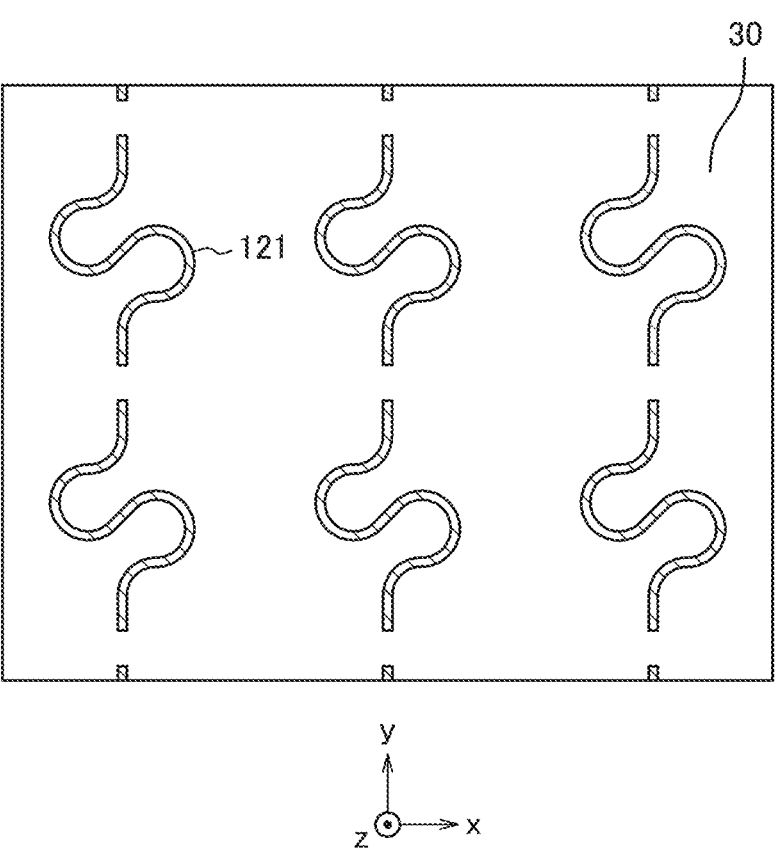
FIG. 24 is a plan view of graphene which constitutes a signal line.

FIGS. 22 through 24 are cross sectional views to show processes to form signal lines 121 shown in FIG. 18. FIG. 22 is a cross sectional view in which the basic structure 10, the first organic insulting film 20 and the second organic insulating film 30 are formed from polyimide on the glass substrate 200. A thickness of the second organic insulating film 30 is, e.g., 1 through 5 μm.

FIG. 23 is a cross sectional view in which laser is focused on and irradiates a surface of the second organic insulating film 30. The portion, to which the laser is applied, is converted to graphene. A thickness, in which graphene is formed, is very thin as 10 nm or less. However, since the conductivity of graphene is very high, the graphene can perform the function as the signal lines 121.

Irradiation with laser as shown in FIG. 20 is not made on all the area of the second organic insulating film 30; the laser beam is drawn as extending meanderingly in longitudinal direction (the y direction) to form signal lines 121. FIG. 24 is a plan view to show such a laser beam drawing. In FIG. 24, the signal lines 121 formed from graphene, which extend meanderingly in longitudinal direction, are formed on the surface of the second insulating film 30.

Figure 25:
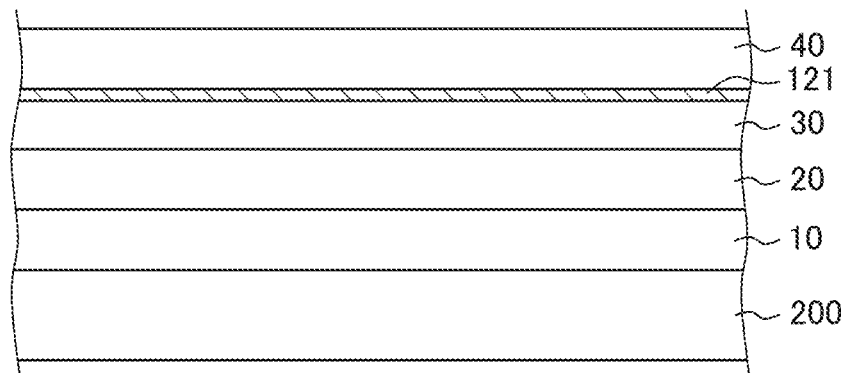
FIG. 25 is a cross sectional view in which a third organic insulating film is formed on signal line side.
Figure 26:
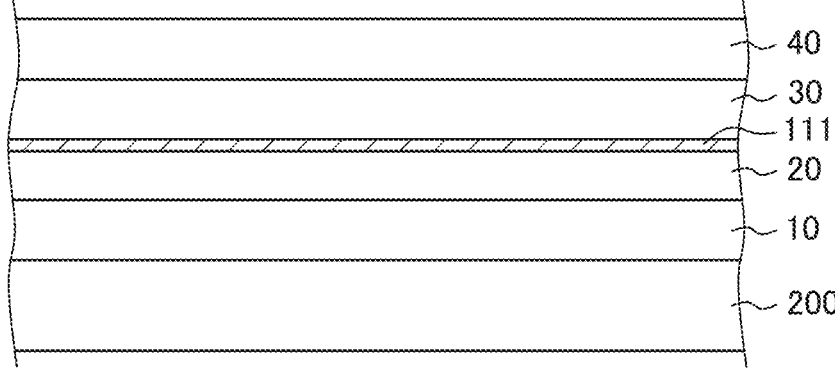
FIG. 26 is a cross sectional view in which a third organic insulating film is formed on scanning line side.

FIG. 25 is a cross sectional view in which the third organic insulating film 40, formed from, e.g., polyimide, is formed on the signal line 121 of graphene formed by processes explained in FIGS. 23 and 24. FIG. 26 is a cross sectional view in which the second organic insulating film 30 and the third organic insulating film 40, formed from, e.g., polyimide, are formed covering the scanning line 111 of graphene formed by processes as explained in FIGS. 20 and 21. The processes below are common to the scanning lines 111 and the signal lines 121, therefore, only the processes in relation with the scanning lines 111 are explained.

Figure 27:
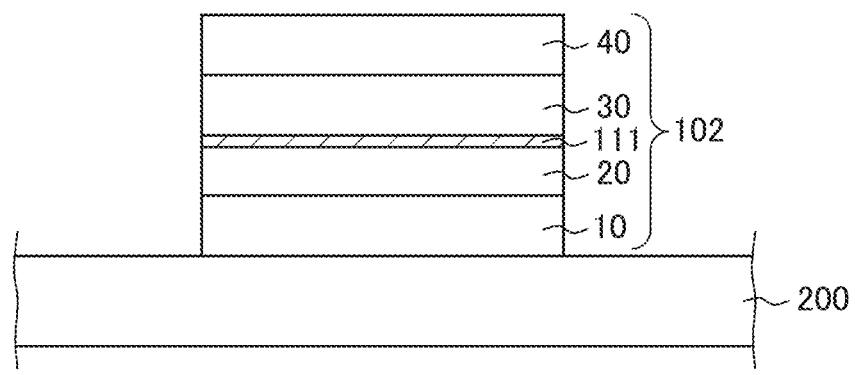
FIG. 27 is a cross sectional view in which the scanning line is pattered to form a mender structure.

FIG. 27 is a cross sectional view in which the basic structure 10, the first organic insulating film 20, the second organic insulating film 30, the third organic insulating film 40 are patterned to the meander structure 102. In this pattering, the element area 101 is simultaneously patterned. That is to say, up to FIG. 26, the scanning line 111 is formed on a plane of first organic insulating film 20 and the signal line 121 is formed on a plane of second organic insulating film 30; the plane structure of the meander area 102 and the element area 101 are determined by patterning depicted by FIG. 27.

Figure 28:
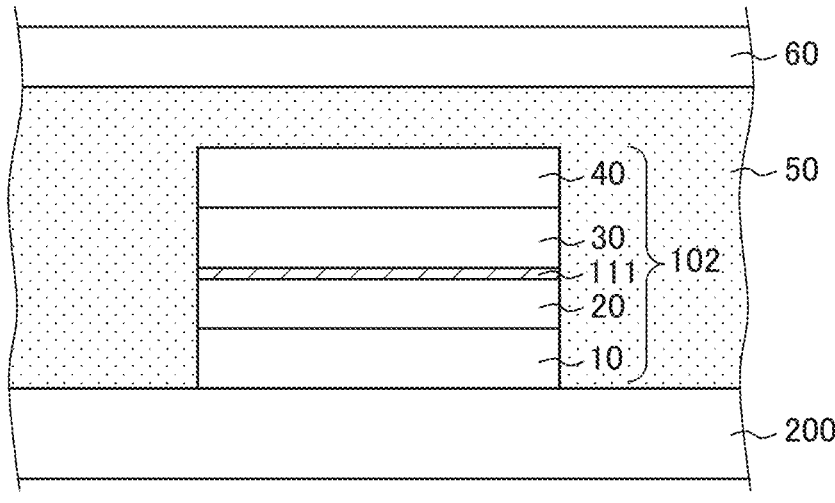
FIG. 28 is a cross sectional view in which a top buffer layer and a top protecting layer are formed on the structure of FIG. 27.

FIG. 28 is a cross sectional view in which a top buffer layer 50 and a top protecting layer 60 are formed covering the third organic insulation film 40. The top buffer layer 50 and the top protecting layer 60 are the same as explained in comparative example. The top buffer layer 50 is filled in a space between the meander structures 102.

Figure 29:
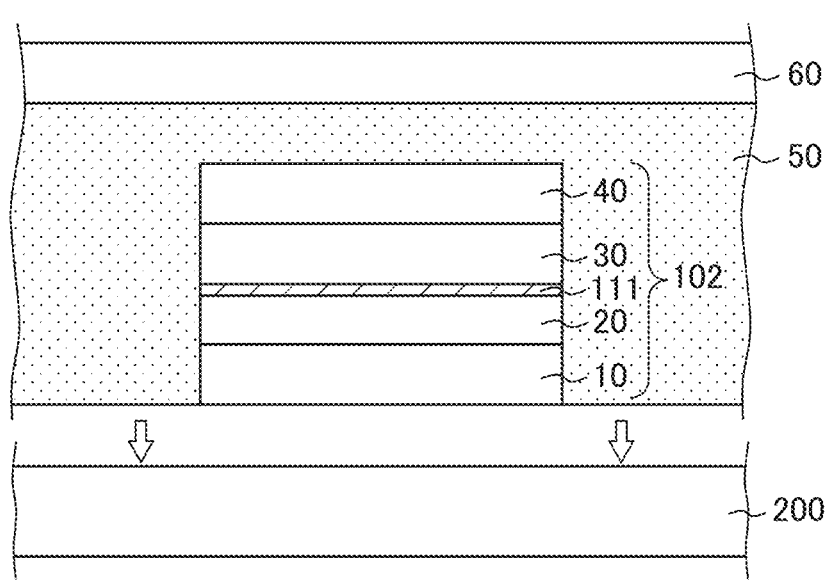
FIG. 29 is a cross sectional view in which a glass substrate is being removed from the structure of FIG. 28.

FIG. 29 is a cross sectional view in which the glass substrate 200 is being peeled off from the basic structure 10 and the top buffer layer 50. A peel off of glass substrate 200 is made as, e.g., so called laser abrasion in which laser is applied to the interface between the glass 200 and the basic structure 10 and the glass 200 and the top buffer layer 50. In the meantime, the scanning lines 111 and the signal lines 121 are in meander structure, which is web shaped in a plan view; however, in the structure of FIG. 29, those are fixed by the top buffer layer 50, therefore, the scanning lines 111 and the signal lines 121 do not come apart even when the glass substrate 200 is removed.

Figure 30:
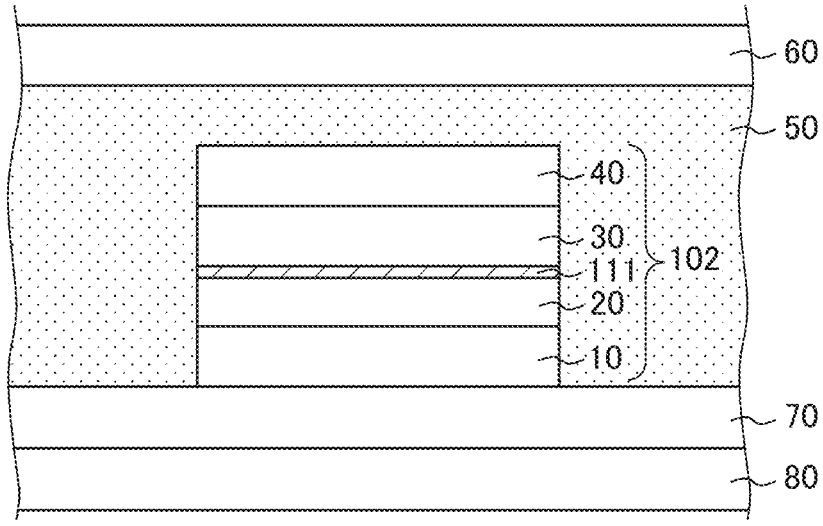
FIG. 30 is a cross sectional view in which a bottom buffer layer and a bottom protecting layer are formed under the structure of FIG. 29.

After that, as shown in FIG. 30, the bottom buffer layer 70 and the bottom protecting layer 80 are formed, then, a planar flexible electronic device is completed. The structure, from which the glass substrate 200 is removed, as shown in FIG. 29, is set upside down; the material for the bottom buffer layer 70 is coated and baked; then, the material for the bottom protecting layer 80 is coated on the bottom buffer layer 70 and baked, thus, the bottom buffer layer 70 and the bottom protecting layer 80 are formed. The manufacturing processes for the cross-sectional structures in the signal lines 121 are the same. In the meantime, the bottom protection film 80 can be omitted according to a usage of the flexible electronic device.

According to the structure of embodiment 1, each of the scanning line 111 formed from the graphene on the first organic insulating film 20 and the signal line 121 formed from the graphene on the second organic insulating film 30 expands and contracts integrally with the first organic insulating film 20 or the second organic insulating film 30, therefore, breaking of the lines resulted from extension and contraction of the flexible electronic device can be avoided.

Embodiment 2

Figure 31:
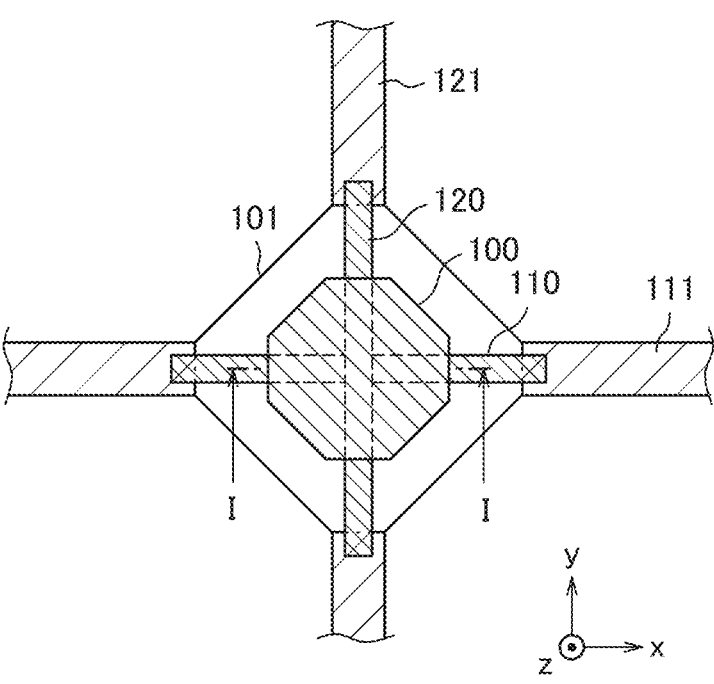
FIG. 31 is a plan view of the element area and its vicinity.

FIG. 31 is a plan view of element area 101 and its vicinity according to embodiment 2. In addition to the elements as sensor, transistors and so forth are formed to control the elements in the element area 102. Therefore, various inorganic films as semiconductors, metal wirings, inorganic insulating films are used. As inorganic insulating films, for example, silicon oxide film (SiO), the silicon nitride film (SiN) and so forth are often used; further sometimes aluminum oxide film (AlO) is used.

Those metal films, inorganic insulating films, semiconductor films and so forth are rigid film, which is broken when it is extended or contracted. However, in the structure of the present invention, as shown in FIG. 11 and FIG. 18, only the scanning line 111 and the signal line 121, which are in meander structure, extend or contract when a flexible electronic device is extended or contracted. As a result, since a strain in the element area 101 can be made smaller, the flexible electronic device is not broken even when hard inorganic material is used in the element area 101.

Figure 32:
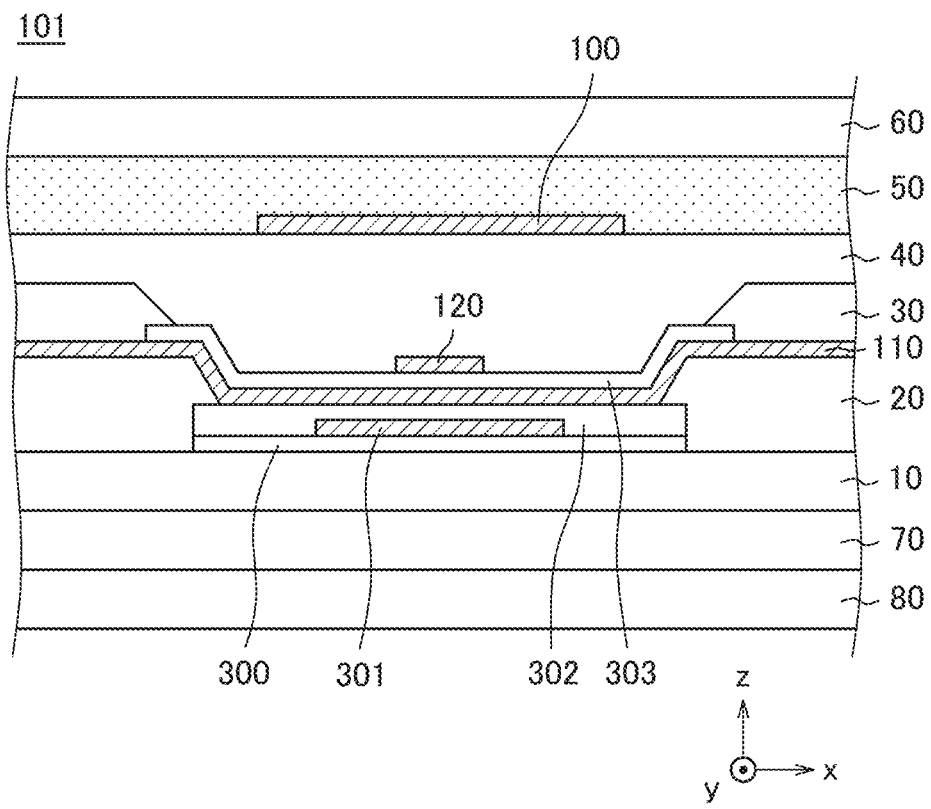
FIG. 32 is a cross sectional view of FIG. 31 along the line I-I.

FIG. 32 is a cross sectional view of FIG. 31 along the line I-I, which is an example of a cross sectional structure of element area 101. In the area of FIG. 32, a metal scanning line 110 is formed as the scanning line and a metal signal line 120 is formed as the signal line. A connection between the metal scanning line 110 and the scanning line 111 formed from graphene can be made as, e.g., the structure of FIG. 13; a connection between the metal signal line 110 and the signal line 121 formed from graphene can be made as, e.g., the structure of FIG. 15.

In FIG. 32, an undercoat film 300 is formed from a laminated layer of SiO film and SiN film on the basic structure 10 formed from polyimide. The semiconductor film 301, for example, to form a transistor is formed on the undercoat film 300. The undercoat film 300 prevents the semiconductor film 301 from being contaminated by impurities from polyimide. A gate insulating film 302 is formed from, e.g., SiN film covering the semiconductor film 301. Edges of both the undercoat 300 and the gate insulating film 302 are covered by the first organic insulating film 20.

The scanning line 110, which has a role of a gate electrode, extends on the gate insulating film 302. The scanning line 110 also extends on the first organic insulating film 20. In FIG. 32, an interlayer insulating film 303 is formed on the scanning line 110; the interlayer insulating film 303 is formed from a SiO film or SiN film, or from a laminated layer of those films. The interlayer insulating film 303 covers the scanning line 110 and the first organic insulating film 20.

The signal line 120 extends in a direction orthogonal to the sheet, namely, in the y direction. The signal lines 120 extends on the interlayer insulating film 303 and the second organic insulating film 30. After that, a third organic insulating film 40 is formed covering the signal line 120 and the second organic insulating film 30. The third organic insulating film 40 has also a role of flattening film.

An element 100 as sensor and so forth is formed on the third organic insulating film 40. The element 100 in FIG. 32 has a plurality of layers as electrode and so forth. In the meantime, the semiconductor film 301 and the element 100 are connected to each other at a place which is not shown in FIG. 32.

By the way, as shown in FIG. 32, a through hole is formed in each of the first organic insulating film 20 and the second organic insulating film 30 at a place corresponding to the element 100 being formed. In the process explained in embodiment 1, the patterning for the outer shape of the first organic insulating film 20 can be made simultaneously with forming a through hole in the first organic insulating film 20; the patterning for the outer shape of the second organic insulating film 30 can be made simultaneously with forming a through hole in the second organic insulating film 30

As described above, in the present invention as shown in, e.g., FIGS. 11 and 18, when the flexible electronic devices are extended or contracted, the region of extension or contraction is mainly bared by the meander structure 102, therefore, the element area 101 is not destroyed even various films of inorganic material are used in the element area 101. In addition, in the present invention, the scanning line 111, which is formed in meander structure 102, is formed integrally with the first organic insulating film 20; and the signal line 121, which is formed in meander structure 102, is formed integrally with the second organic insulating film 30; therefore, a risk of breaking of wirings can be made small when the flexible electronic device is extended and contracted.

As described above, according to the present invention, a flexible electronic device, which can be stretched or contracted, of high reliability can be realized. In the meantime, the cross-sectional views of the flexible electronic device are just examples; the present invention can be used in a flexible electronic device which has a different cross-sectional structure.

A configuration of a scan line driving circuit, a signal line driving circuit, power source and so forth can be different from the structure of FIG. 1; accordingly, layers for the scan line driving circuit, the signal line driving circuit, the power source and so forth can be different from the layers in embodiments. However, the present invention is applicable to those structures.

What is claimed is:

1. An electronic device comprising:
   a plurality of element areas, arrayed in a first direction with a first distance, and arrayed in a second direction with a second distance,
   the plurality of element areas being connected with each other in the first direction by a first organic insulating film, which meanderingly extends in the first direction,
   graphene being formed on a surface of the first organic insulating film to form a first wiring,
   the plurality of element areas being connected with each other in the second direction by a second organic insulating film, which meanderingly extends in the second direction,
   graphene being formed on a surface of the second organic insulating film to form a second wiring,
   wherein the plurality of element areas, the first organic insulating film and the second organic insulating film are formed on a basic structure which is formed from organic insulating film,
   wherein each of the basic structure, the first organic insulating film and the second organic insulating film has a meander structure.

2. The electronic device according to claim 1,
   wherein the element area includes an inorganic insulating film.

3. The electronic device according to claim 1,
wherein the basic structure, the first organic insulating film and the second organic insulating film are formed from polyimide.

4. The electronic device according to claim 1,
wherein an elongation in which a flexible electronic device is broken is 10% or more.

5. The electronic device according to claim 1,
wherein an element formed in each of the plurality of element areas includes a transistor or a diode.

6. The electronic device according to claim 1,
wherein an element formed in each of the plurality of element areas includes either one of a photo sensor, a temperature sensor, a pressure sensor, a touch sensor, and a photo receiving sensor.

7. The electronic device according to claim 1,
wherein an element formed in each of the plurality of element areas is an actuator.

8. An electronic device comprising:
a plurality of element areas, arrayed in a first direction with a first distance, and arrayed in a second direction with a second distance,
the plurality of element areas being connected with each other in the first direction by a first organic insulating film, which meanderingly extends in the first direction,
graphene being formed on a surface of the first organic insulating film to form a first wiring,
the plurality of element areas being connected with each other in the second direction by a second organic insulating film, which meanderingly extends in the second direction,
graphene being formed on a surface of the second organic insulating film to form a second wiring,
wherein a third wiring, which extends in the first direction, is formed from a first metal, and a fourth wiring, which extends in the second direction, is formed from a second metal, and
the first wiring and the third wiring are connected with each other, and the second wiring and the fourth wiring are connected with each other.

9. The electronic device according to claim 8,
wherein an edge of the third wiring overlaps the first wiring, and
an edge of the fourth wiring overlaps the second wiring.

10. The electronic device according to claim 1,
wherein the first wiring and the third wiring are scanning lines, and the second wiring and the fourth wiring are signal lines.

11. An electronic device comprising:
a plurality of element areas, arrayed in a first direction with a first distance, and arrayed in a second direction with a second distance,
the plurality of element areas being connected with each other in the first direction by a first organic insulating film, which meanderingly extends in the first direction,
graphene being formed on a surface of the first organic insulating film to form a first wiring,
the plurality of element areas being connected with each other in the second direction by a second organic insulating film, which meanderingly extends in the second direction,
graphene being formed on a surface of the second organic insulating film to form a second wiring,
wherein the plurality of element areas, the first organic insulating film and the second organic insulating film are formed on a basic structure which is formed from organic insulating film,
wherein the second organic insulating film is covered by a third organic insulating film,
the third organic insulating film is formed in the element area, and
an element formed in the element area is formed on the third organic insulating film.

12. The electronic device according to claim 11,
wherein the third organic insulating film has a meander structure.

13. The electronic device according to claim 11,
wherein a side surface of the third organic insulating film and the basic structure is covered by a fourth organic insulating film, and
young's modulus of the fourth organic insulating film is smaller than young's modulus of the basic structure.

14. The electronic device according to claim 13,
wherein a fifth organic insulating film is formed under a bottom surface of the basic structure and the fourth organic insulating film.

15. The electronic device according to claim 14,
wherein young's modulus of the fifth organic insulating film is smaller than young's modulus of the basic structure.

* * * * *